(12) United States Patent
Nam

(10) Patent No.: US 9,434,034 B2
(45) Date of Patent: Sep. 6, 2016

(54) METHOD OF MANUFACTURING CEMENTED CARBIDE CUTTING TOOL AND CUTTING TOOL MANUFACTURED BY THE METHOD

(71) Applicant: Jung Woo Nam, Seoul (KR)

(72) Inventor: Jung Woo Nam, Seoul (KR)

(*) Notice: Subject to any disclaimer, the term of this patent is extended or adjusted under 35 U.S.C. 154(b) by 0 days.

(21) Appl. No.: 14/796,321

(22) Filed: Jul. 10, 2015

(65) Prior Publication Data

US 2016/0144468 A1    May 26, 2016

Related U.S. Application Data

(63) Continuation of application No. PCT/KR2015/004785, filed on May 13, 2015.

(30) Foreign Application Priority Data

Nov. 20, 2014   (KR) .................. 10-2014-0162650

(51) Int. Cl.
*B23P 15/32* (2006.01)
*B23P 15/40* (2006.01)
(Continued)

(52) U.S. Cl.
CPC ............. *B23P 15/32* (2013.01); *B23B 51/00* (2013.01); *B23C 5/18* (2013.01); *B23K 5/003* (2013.01);
(Continued)

(58) Field of Classification Search
CPC .......... B23B 2222/28; B23B 2222/84; B23B 2228/10; B23B 2240/16; B23B 51/00; B23C 2210/03; B23C 2222/28; B23C 2222/84; B23C 2228/10; B23C 2240/16; B23C 5/18; B23K 20/10; B23K 2203/04; B23K 2203/18; B23K 2203/52; B23K 5/003; B23K 5/12; B23P 15/32; B23P 15/34; B23P 15/40; C21D 1/613; C21D 1/773; C21D 9/22; C23C 14/0641
See application file for complete search history.

(56) References Cited

U.S. PATENT DOCUMENTS 4,890,782 A * 1/1990 Nakai .................. B23K 31/025
                                             228/114
5,409,371 A * 4/1995 Gordon ................ B01D 53/326
                                             431/127

(Continued)

FOREIGN PATENT DOCUMENTS

EP         2 270 246 A1 * 1/2011
JP         2001047308        2/2001

(Continued)

OTHER PUBLICATIONS

English translation (dated Jul. 7, 2016) of JP 2008-12653 (published on Jan. 24, 2008).*

(Continued)

*Primary Examiner* — Hwei C Payer
(74) *Attorney, Agent, or Firm* — Cantor Colburn LLP

(57) ABSTRACT

Method of manufacturing a cemented carbide cutting tool, includes a) bonding a body part of hot work tool steel and a cutting part of cemented carbides together by heat treatment; b) cooling the bonded body part and cutting part for a preset period of time; c) machining the cutting part to have a predetermined pattern according to its application and forming a cutting tool; d) coating a surface of the machined cutting tool with a film of at least one of metallic oxides, nitrides and carbides; and e) cooling the coated cutting tool for a preset period of time in air, and a cutting tool manufactured by the method. Cracks do not generate even after the coating step, and thus cemented carbide cutting tool having excellent mechanical properties may be manufactured.

4 Claims, 8 Drawing Sheets

(51) Int. Cl.
  *B23B 51/00* (2006.01)
  *B23C 5/18* (2006.01)
  *B23K 5/00* (2006.01)
  *C23C 14/06* (2006.01)
  *B23K 20/10* (2006.01)
  *C21D 1/84* (2006.01)
  *C21D 1/773* (2006.01)
  *C21D 1/613* (2006.01)
  *C21D 9/22* (2006.01)
  *B23K 5/12* (2006.01)
  *B23P 15/34* (2006.01)

(52) U.S. Cl.
  CPC .............. *B23K 5/12* (2013.01); *B23K 20/10* (2013.01); *B23P 15/34* (2013.01); *B23P 15/40* (2013.01); *C21D 1/613* (2013.01); *C21D 1/773* (2013.01); *C21D 1/84* (2013.01); *C21D 9/22* (2013.01); *C23C 14/0641* (2013.01); *B23B 2222/28* (2013.01); *B23B 2222/84* (2013.01); *B23B 2228/10* (2013.01); *B23B 2240/16* (2013.01); *B23C 2210/03* (2013.01); *B23C 2222/28* (2013.01); *B23C 2222/84* (2013.01); *B23C 2228/10* (2013.01); *B23C 2240/16* (2013.01); *B23K 2203/04* (2013.01); *B23K 2203/18* (2013.01); *B23K 2203/52* (2015.10)

(56) References Cited

U.S. PATENT DOCUMENTS

| | | | |
|---|---|---|---|
| 7,186,324 B2* | 3/2007 | Yamamoto | C23C 14/0641 204/279 |
| 7,922,428 B2* | 4/2011 | Weerasinghe | C23C 14/042 408/144 |
| 8,349,474 B2* | 1/2013 | Morstein | B23F 21/16 428/216 |
| 8,679,227 B2* | 3/2014 | Falconer | B01D 53/228 427/226 |
| 2002/0166606 A1* | 11/2002 | Caminiti | B32B 15/012 148/212 |
| 2006/0006059 A1* | 1/2006 | Kohara | C23C 14/0036 204/192.15 |
| 2016/0144468 A1* | 5/2016 | Nam | B23P 15/32 407/118 |

FOREIGN PATENT DOCUMENTS

| | | |
|---|---|---|
| JP | 2005186179 | 7/2005 |
| JP | 2008012653 | 1/2008 |
| KR | 200256477 | 12/2001 |
| KR | 101099395 | 12/2011 |

OTHER PUBLICATIONS

Korean Office Action—Korean Application No. 10-2014-0162650 issued on Jan. 16, 2015, citing JP 2008-012653 and JP 2001-047308.

\* cited by examiner

METHOD OF MANUFACTURING CEMENTED CARBIDE CUTTING TOOL AND CUTTING TOOL MANUFACTURED BY THE METHOD

CROSS REFERENCE TO RELATED APPLICATIONS

This application is a continuation application of International Application No. PCT/KR2015/004785 filed on May 13, 2015, which claims priority to and the benefit of Korean Application No. 10-2014-0162650 filed on Nov. 20, 2014, in the Korean Patent Office, the entire contents of which are incorporated herein by reference.

BACKGROUND

1. Field of the Invention

The present invention relates to a method of manufacturing a cutting tool of which only a cutting part is formed of cemented carbides, and more particularly, to a method of manufacturing a cemented carbide cutting tool having high mechanical property as cracks in the cemented carbide cutting tool do not generate even after a high temperature coating process, and a cutting tool manufactured by the method.

2. Related Art

Cutting tools such as an end-mill used in a milling machine, a drill for machining an aperture, and a cold and hot punch include a cutting part at a front end thereof, and a shank part integrally formed with the cutting part. The cutting tools should have excellent mechanical properties such as durability, wear resistance and machinability, and thus are generally manufactured of hard metal.

However, since cemented carbides used as a tool material is very expensive, the cutting tools in which only the cutting part except the shank part is formed of cemented carbides are manufactured.

A related art document 1 (Korean Utility Model Registration No. 20-0256477) discloses a carbide tipped brazed tool of which a shank part is formed of tool steel, and a cutting part is formed of cemented carbides wherein a nickel thin sheet is inserted into a butt joint portion between the shank part and the cutting part and then to integrally form the shank part with the cutting part by brazing. Also, a related art document 2 (Korean Patent No. 10-1099395) discloses a cemented carbide cutting tool including a machining part of a cemented carbide material and a supporting part of a general metal, and a manufacturing method thereof wherein processed powders used as a starting material for the machining part and the supporting part are sintered in a vacuum chamber by spark plasma sintering and integrally formed.

As described above, in the related art documents 1 and 2, only the cutting part, i.e., the machining part is formed of cemented carbides, and thus a manufacturing cost of the tool may be reduced.

Here, in the case of another cutting tool as well as the cemented carbide cutting tools disclosed in the related art documents, an additional process of coating a diamond film or a titanium aluminum nitride on the surface of the tool was required to provide for excellent mechanical properties such as durability, wear resistance and machinability.

However, in the case of a cutting tool in which both of the shank part and the cutting part are formed of cemented carbides, there occurs no problem in the above coating while in the case of another cutting tool in which only the cutting part is formed of cemented carbides, cracks may occur at the surface of the tool after a heat treatment applied upon the coating process since the shank part and the cutting part have different thermal expansion coefficients from each other.

SUMMARY OF THE INVENTION

The object of the present invention is to provide a method of manufacturing a cemented carbide cutting tool being capable of preventing cracks from occurring at surfaces of a body part and a cutting part after a high temperature coating process.

Another object of the present invention is to provide a cemented carbide cutting tool being capable of securing a space between a cutting part and a regrinding tool, thereby to easily regrind the cutting part and to accurately machine a surface of a workpiece.

According to an aspect of the present invention, there is provided a method of manufacturing a cemented carbide cutting tool, including a) heating and bonding a body part of hot work tool steel and a cutting part of cemented carbides; b) cooling the bonded body part and cutting part for a preset period of time; c) machining the cutting part to have a predetermined pattern according to its purpose and forming a cutting tool; d) coating a surface of the machined cutting tool with a film of at least one of a metallic oxide, a nitride and a carbide; and e) cooling the coated cutting tool for a preset period of time in air, and a cutting tool manufactured by the method.

Preferably, in the step a), the body part and the cutting part of the cemented carbide may be bonded at a temperature of 800 to 1200° C. by high-frequency welding or oxygen welding wherein the body part may comprises a hot work die(tool) steel such as SKD61.

Preferably, in the step b), the bonded body part and cutting part may be cooled slowly for 24 hours in a vacuum chamber.

Preferably, in the step c), the cutting part may be ground by a relief grinder so that a plurality of blades having the same cutting relief angle are formed of a curved shape in a circumferential direction of the cutting part.

Preferably, in the step d), a titanium aluminum nitride (TiAlN) may be deposited on a surface of the cutting tool at a temperature of 400 to 700° C. with a thickness of 2 to 4 micro-meters.

According to another aspect of the present invention, there is provided a cemented carbide cutting tool manufactured by the above-described method, wherein the body part has a plurality of grooves and wings, and each of the wings is machined so that a lateral end surface of the each of the wings has an "L" shape, and the cutting part is bonded to the lateral end surface thereof machined to have the "L" shape.

Preferably, the plurality of grooves and the wings may be arranged in a diagonal line along an axial direction of the body part. The wings may have a plurality of "L"-shaped blade bonding portions which are spaced apart from each other in a lengthwise direction, and the cutting part may be bonded to the blade bonding portion so as to be exposed to an outside of the groove.

Preferably, the cutting part may include a chip breaker formed of a slit shape.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, a method of manufacturing a cemented carbide cutting tool according to exemplary embodiments of the present invention will be described in detail with reference to the accompanying drawings.

Figure 1:
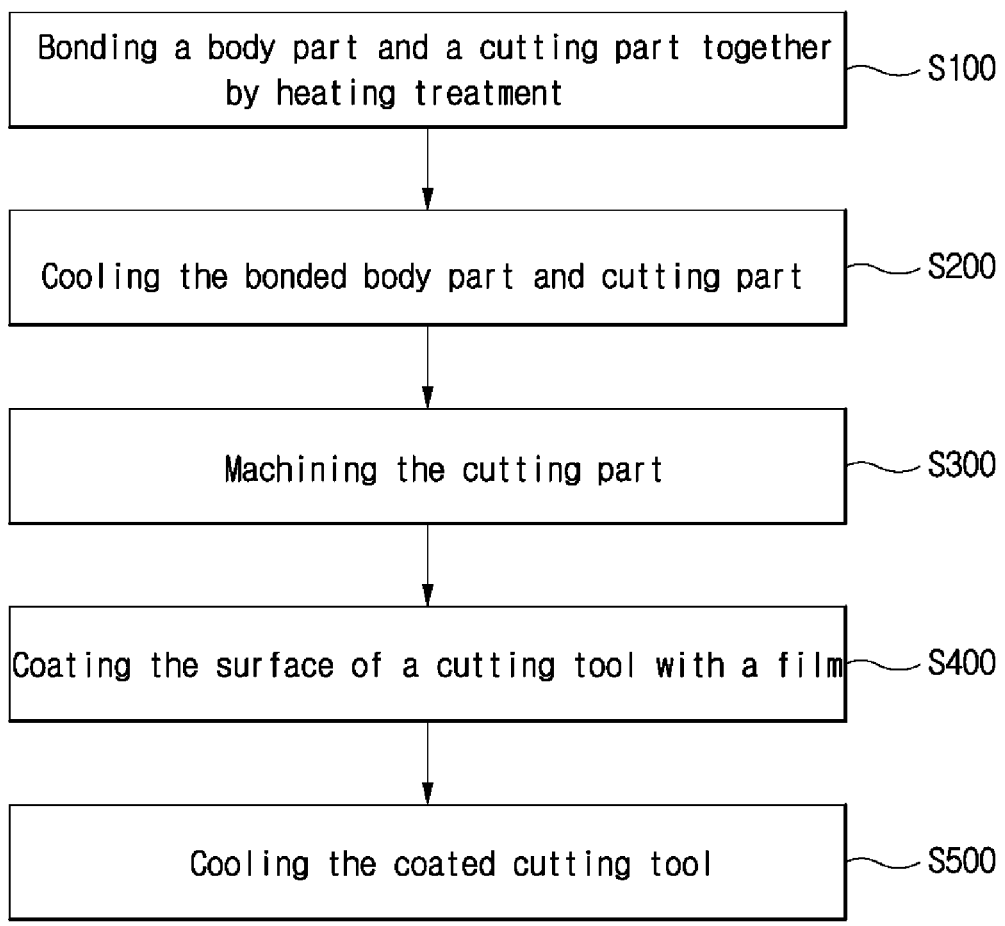
FIG. 1 is a flowchart schematically illustrating a method of manufacturing a cemented carbide cutting tool according to the present invention.
Figure 2A:
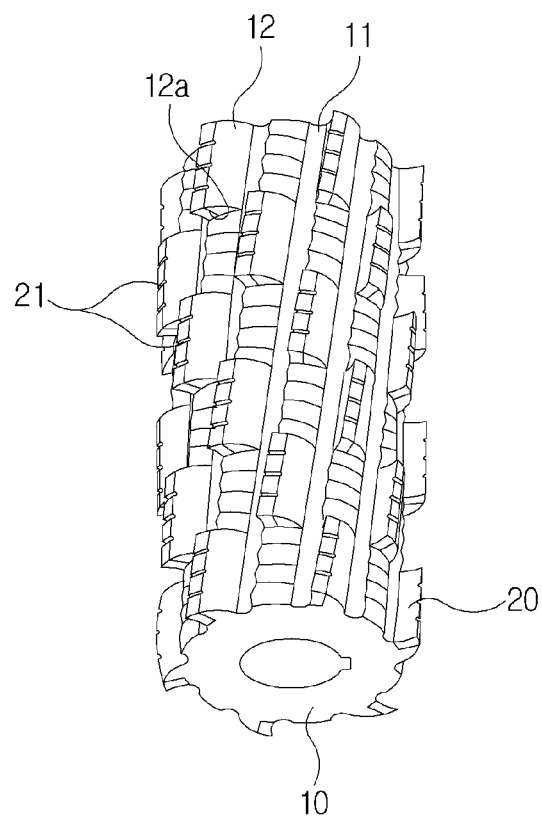
FIGS. 2A and 2B are views of a plain milling cutter manufactured by the method of manufacturing the cemented carbide cutting tool according to the present invention.
Figure 2B:
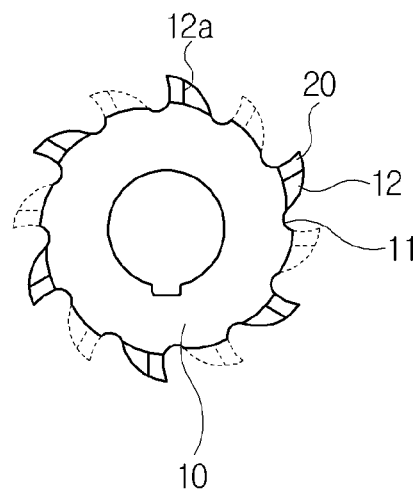

Referring to FIGS. 1, 2A and 2B, a manufacturing method according to the present invention includes a step S100 of bonding a body part 10 and a cutting part 20 together by heat treatment; a step S200 of cooling the bonded body part 10 and cutting part 20; a step S300 of machining the cutting part 20 as cooled; a step S400 of coating a surface of a cutting tool with a film; and a steps 500 of cooling the coated cutting tool.

First, in the step S100 of bonding the body part 10 and the cutting part 20 together by heat treatment, a bonding portion of the body part of hot work tool steel such as SKD61 is bonded by brazing or welding to that of the cutting part of cemented carbides at a temperature of 800 to 1200° C. In this bonding step, it is preferable that the body part 10 and the cutting part 20 are bonded to each other by high-frequency welding or oxygen welding.

Also, through the bonding step, the body part 10 and the cutting part 20 are bonded to each other and also heat treated. By heating treatment, the body part 10 formed of SKD661 has a Rockwell hardness of about HRC 55, and the cutting part 20 formed of the cemented carbides has a Rockwell hardness of about HRC 93 to 97.

Here, the cutting part 20 may be a tungsten-carbide based cemented carbide alloy including 84.5 wt % tungsten carbide (WC), 1.5 wt % tantalum & niobium double carbide powder (TaNbC) and 14 wt % cobalt (Co). Also, the cutting part 20 may be a tungsten-carbide based alloy including tungsten 85 to 88 wt % tungsten carbide (WC) and 11 to 13 wt % cobalt (Co). Since tungsten-carbide based alloy exhibits higher hardness, more excellent wear resistance than high-speed steel or stellite and also exhibits good hardness at a high temperature, tungsten-carbide based alloy may be used for the cutting part 20 by being bonded to one portion of the body part 10.

In the step S200 of cooling the bonded body part 10 and cutting part 20, the body part 10 and the cutting part 20 bonded by brazing or welding are slowly cooled for a predetermined period of time in the vacuum chamber. The body part 10 and the cutting part 20 of different thermal expansion coefficients are treated by heat treatment and cooling during bonding step by heat treatment S100 and cooling step S200. In particular, in the case that the body part 10 is formed of SKD61 and the cutting part 20 is formed of tungsten-carbide based alloy, the body part 10 and the cutting part 20 are left for 24 hours at a room temperature in a vacuum chamber so as to be slowly cooled. Then, the body part 10 and the cutting part 20 may be treated (regulated) to have the same heat expansion coefficient. Such treatment of the body part 10 and the cutting part 20 for obtaining the same thermal expansion coefficient serves to prevent cracks from occurring at the bonding portions of the body part 10 and the cutting part 20 even after heat is applied to the body part 10 and the cutting part 20 in the coating step S400 to be described later.

In the step S300 of machining the cutting part 20, the cutting part 20 is machined to have a predetermined pattern according to its application, i.e., the type of a cutting tool to be manufactured. For example, a plain milling cutter illustrated in FIGS. 2A and 2B, an end-mill illustrated in FIGS. 3A and 3B, a profiling milling cutter illustrated in FIGS. 4A and 4B, a serration milling cutter illustrated in FIGS. 5A and 5B, a slot milling cutter illustrated in FIGS. 6A and 6B and a hob illustrated in FIGS. 7A and 7B may be machined according to a machining pattern of the cutting part.

In the machining step S300, the cutting part 20 is ground by a relief grinder. At this time, the cutting part 20 is machined such that the cutting part 20 have a plurality of blades having the same cutting relief angle which are formed of a curved shape in a circumferential direction of the cutting part. Due to such a shape of the cutting part, the cutting tool has a skiving function. That is, the cutting tool may very accurately machine a surface of a workpiece.

In the step S400 of coating the surface of the cutting tool with a film, the film including at least one of metallic oxides, nitrides and carbides is coated on the machined surface of the cutting tool to enhance mechanical properties of the cutting tool, such as hardness, wear resistance and oxidation resistance.

In this coating step S400, the coating film may be coated on the surface of the cutting tool by a physical vapor deposition (PVD) method or a chemical vapor deposition (CVD) method. A coating temperature is maintained at a temperature of 400 to 700° C., and the coating film is formed to have a thickness of 2 to 4 micro-meters. Thanks to the coating film, the cutting tool after the coating step exhibits mechanical properties about 1.5 times as high as the cutting tool before the coating step.

At this time, the body part 10 and the cutting part 20 of the cutting tool are expanded due to a high coating temperature. However, since the body part 10 and the cutting part 20 are treated in the above-described cooling step S200 to have the same thermal expansion coefficient, cracks do not occur at the bonding portions of the body part 10 and the cutting part 20, even after the coating step S400 in which heat is applied to the body part 10 and the cutting part 20. Furthermore, when a cutting tool is worn, the above coating process may be easily performed even after a regrinding process, and performance of the tool may be thus constantly maintained.

Meanwhile, in order to enhance wear resistance, the material of the film may be oxides, carbides or nitrides of transition metal of groups IV, V and VI of the periodic table or of element selected from the group consisting of silicon, boron and aluminum. Also, coating film may be coated with diamond and boron nitride compound (cBN) to be used in a wide range of cutting applications. In particular, diamond is material which has the hardest hardness and has also excellent thermal conductivity, wear resistance and electric resistance, and is thus suitable for material for coating film.

Also, one or more layers of the coating film may be formed of microcrystalline alumina ($Al_2O_3$) deposited by the PVD method, and in the case of a non-$Al_2O_3$ layer, the non-$Al_2O_3$ layer may include one or more refractory compound among nitrides and/or carbides of metal selected from Ti, Nb, Hf, V, Ta, Mo, Zr, Cr, W and Al.

Further, the coating film may include various hard films of heat resistant transition metallic nitrides or carbides, such as binary-TiN and TiC, ternary-TiAlN, AlCrN, quaternary TiAlSiN, and diamond-like carbon (DLC) deposited by the PVD method and the CVD method. Among them, TiAlN film formed by the PVD method has mechanical properties such as high hardness and excellent oxidation resistance and is thus the most suitable for the coating film.

Then, in the step S500 of cooling the coated cutting tool, the coated cutting tool of high temperature is cooled in air for a preset period of time. When the cooling step S500 ends, the cutting tool with only a tip portion bonded to cemented carbides is completed.

As described above, in the present invention, the body part 10 and the cutting part 20 of different kinds of materials are bonded at high temperature, and then slowly cooled in a vacuum atmosphere. Therefore the two parts may be regulated to have the same thermal expansion coefficient. As a result, in the high temperature coating step, cracks may be prevented from occurring at the bonding portions of the body part 10 and the cutting part 20.

Hereinafter, a cutting tool manufactured by the method of manufacturing the cemented carbide cutting tool according to the present invention will be described with reference to the accompanying drawings.

First, referring to FIGS. 2A and 2B, a plain milling cutter manufactured through the above-described steps S100 to S500 is illustrated. The plain milling cutter includes the body part 10 of hot work tool steel and the cutting part 20 of cemented carbides. The body part 10 is machined in advance before the bonding step S100 to have a plurality of grooves 11 and a plurality of wings 12.

In the step of machining the cylindrical body part 10, the plurality of grooves 11 and wings 12 which are arranged to be inclined by about 7 to 23 degrees relative to a lengthwise direction of the cylindrical body part 10, i.e., an axial direction thereof are formed. Here, the wings 12 are machined so that a lateral end surface of each of the wings has an "L" shape. And the cutting part 20 is bonded to the lateral end surface of each of the wings 12 which is machined to have the "L" shape. The bonding of the cutting part 20 and the wing 12 is performed in accordance with the above-described bonding step S100.

Preferably, the grooves 11 and the wings 12 of the body part 10 are arranged in a diagonal line along axial direction of the body part 10, and the wings 12 have a plurality of "L"-shaped blade bonding parts 12a for cutting which are spaced apart from each other along the lengthwise direction. The cutting part 20 is bonded to the bonding part 12a for cutting part to be exposed to an outside of the groove 11. A protruding structure of the cutting part 20 is advantageous for regrinding required when the cutting tool is worn. In other words, the cutting part 20 exposed to the outside of the body part 10 may secure a contact space with a regrinding tool due to a space of the groove 11, and regrinding of the cutting part 20 may be thus easily performed.

Also, as described above, in the machining step S300 of the cutting part 20, the cutting part 20 is ground by a relief grinder so as to have the same cutting relief angle in the circumferential direction. Therefore, the cutting part 20 is formed of a curved shape which is bent in an opposite direction to a rotating direction of the tool. Such a curved cutting part 20 may allow a smooth contact angle to be formed between the cutting part 20 and the workpiece, when the workpiece is machined by the plain milling cutter, and thus may reduce the wear of the cutting part 20, and also may allow the workpiece to be accurately machined. That is, the cutting tool 20 may have skiving function due to a shape of the cutting part 20. Therefore, the cutting tool may very accurately machine the surface of the workpiece.

Meanwhile, the cutting part 20 may have a chip breaker 21 formed of a slit shape. The chip breaker 21 is machined such that a plurality of gear teeth are formed at an end of the cutting part 20. Therefore, thanks to the chip breaker, chips do not fuse and are smoothly discharged smoothly at the time of cutting.

Figure 3A:
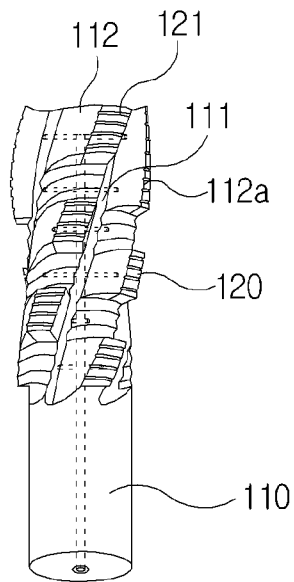
FIGS. 3A and 3B are views of an end-mill manufactured by the method of manufacturing the cemented carbide cutting tool according to the present invention.
Figure 3B:
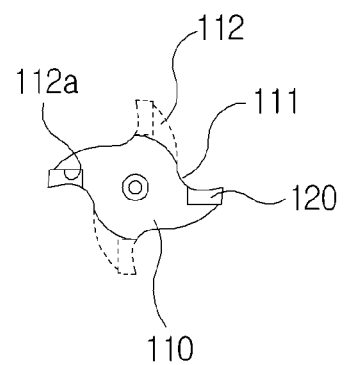
Figure 4A:
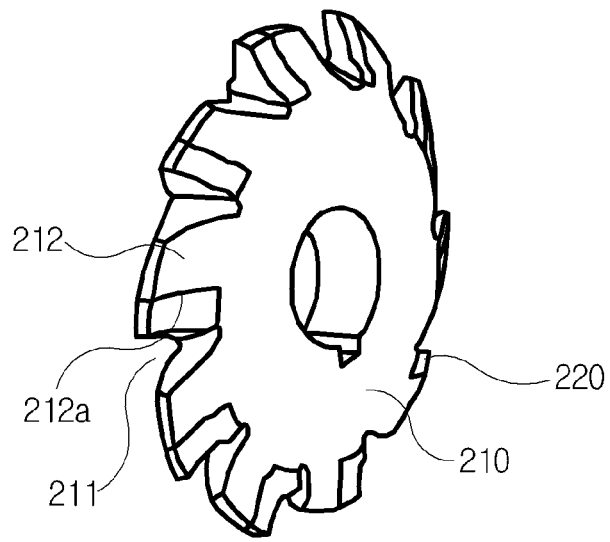
FIGS. 4A and 4B are views of a profiling milling cutter manufactured by the method of manufacturing the cemented carbide cutting tool according to the present invention.
Figure 4B:
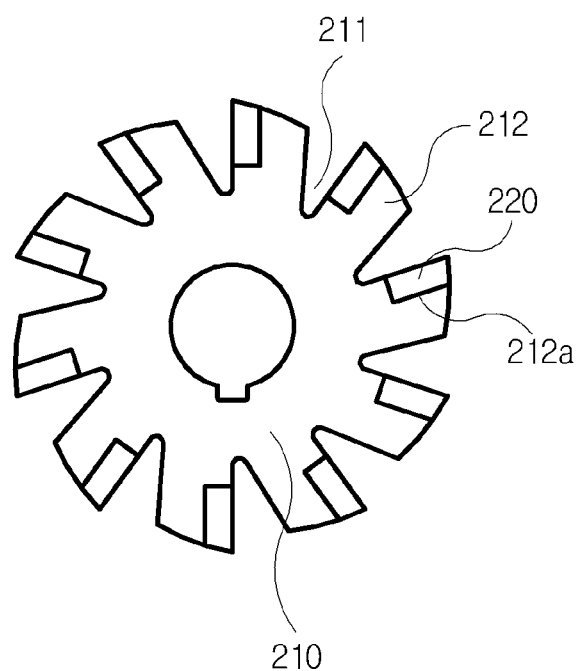
Figure 5A:
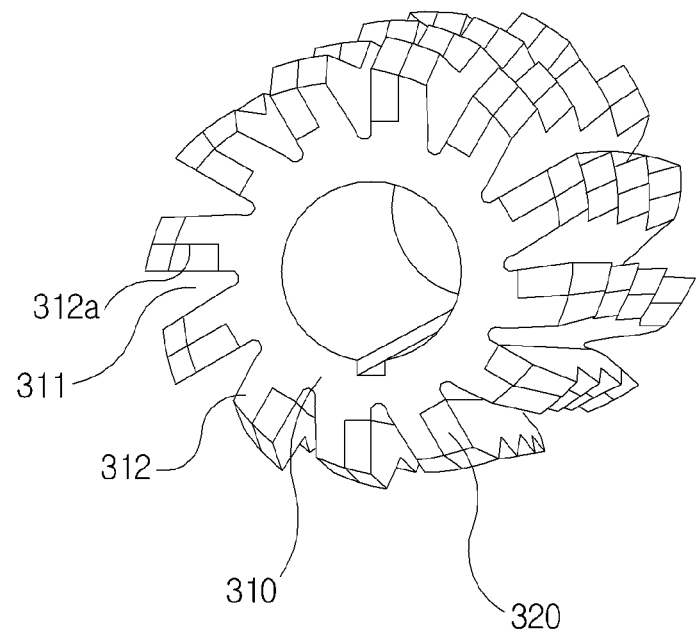
FIGS. 5A and 5B are views of a serration milling cutter manufactured by the method of manufacturing the cemented carbide cutting tool according to the present invention.
Figure 5B:
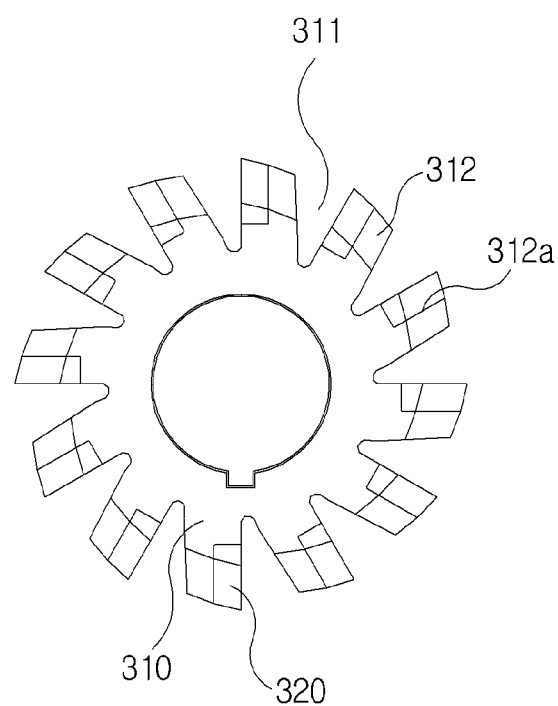
Figure 6A:
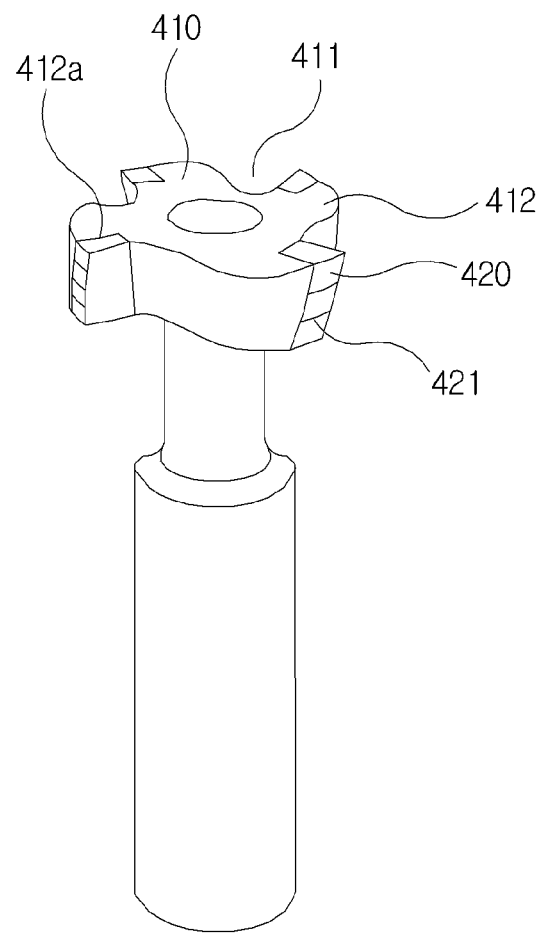
FIGS. 6A and 6B are views of a slot milling cutter manufactured by the method of manufacturing the cemented carbide cutting tool according to the present invention.
Figure 6B:
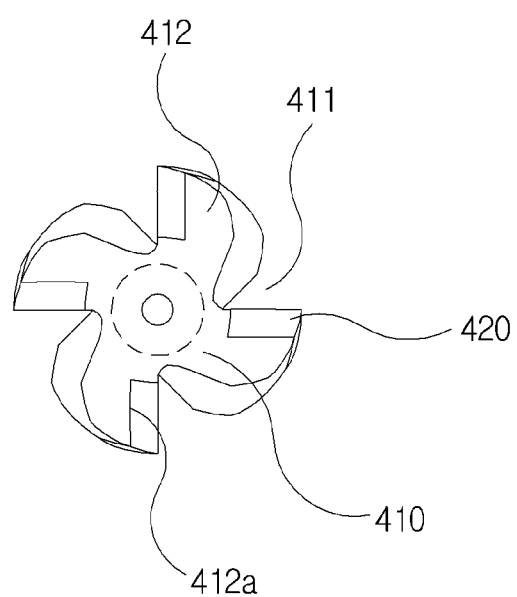
Figure 7A:
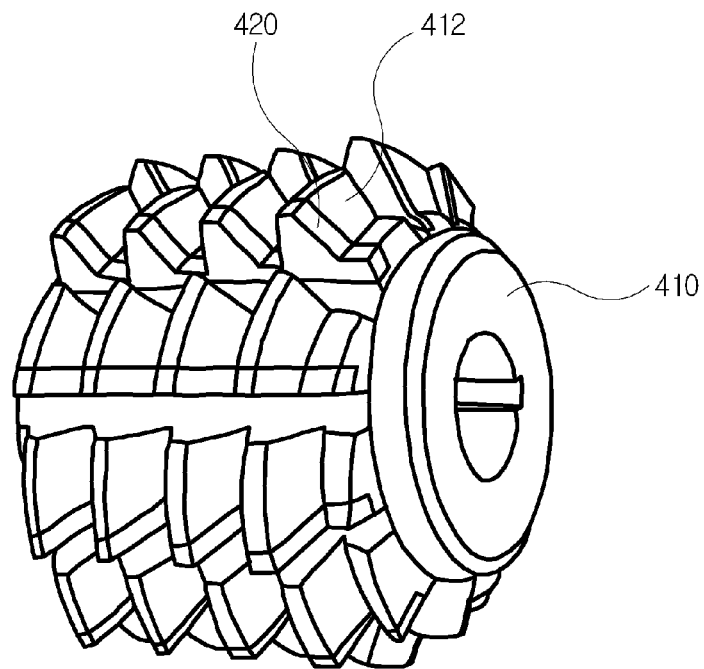
FIGS. 7A and 7B are views of a hob manufactured by the method of manufacturing the cemented carbide cutting tool according to the present invention.
Figure 7B:
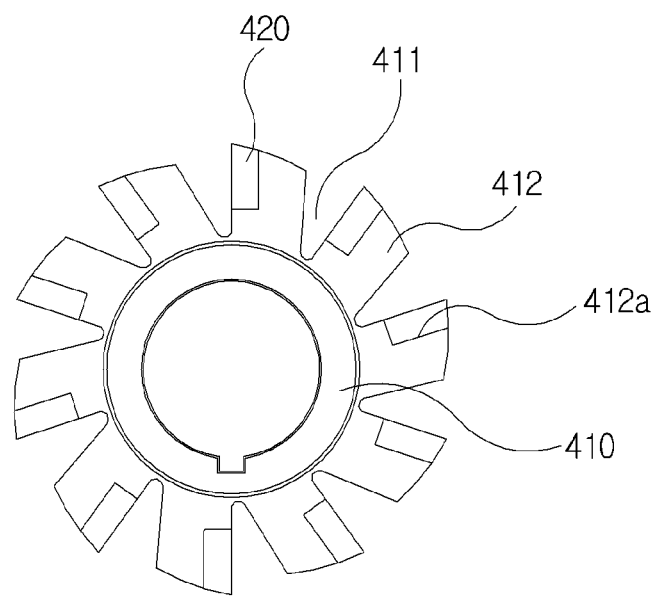

Meanwhile, FIGS. 3A and 3B illustrate an end-mill; FIGS. 4A and 4B illustrate a profile milling cutter; FIGS. 5A and 5B illustrate a serration milling cutter; FIGS. 6A and 6B illustrate a slot milling cutter; and FIGS. 7A and 7B illustrate the hob. In all of these cutting tools, cemented carbides are bonded to the tip portions manufactured through the above-described manufacturing steps S100 to S500.

Referring to FIGS. 3A to 7B, like the plain milling cutter, the cutting tools include body parts 110, 210, 310, 410 and 510 of hot tool steel, and cutting parts 120, 220, 320, 420 and 520 of cemented carbides. The body parts 110, 210, 310, 410 and 510 are machined in advance before the bonding step S100 so that a plurality of grooves 111, 211, 311, 411 and 511 and wings 112, 212, 312, 412 and 512 are formed.

In the step of machining the body parts 110, 210, 310, 410 and 510, the plurality of grooves 111, 211, 311, 411 and 511 and wings 112, 212, 312, 412 and 512 are formed in the body parts. Here, the wings 112, 212, 312, 412 and 512 are machined such that a lateral end surface of each of the wings has an "L" shape. And the cutting parts 120, 220, 320, 420 and 520 are bonded to the lateral end surfaces of the wings machined to have the "L" shape. The bonding of the cutting parts and the wings is performed in accordance with the above-described bonding step S100.

Preferably, the wings 112, 212, 312, 412 and 512 have a plurality of "L"-shaped bonding parts 112a, 212a, 312a, 412a and 512a for cutting parts. The cutting parts 120, 220, 320, 420 and 520 are bonded to the bonding parts 112a, 212a, 312a, 412a and 512a for cutting parts to be exposed to an outside of the grooves 111, 211, 311, 411 and 511. Like this, the cutting parts 120, 220, 320, 420 and 520 exposed to the outside of the body parts 110, 210, 310, 410 and 510 may secure contact spaces with a regrinding tool by spaces of the grooves 111, 211, 311, 411 and 511, and regrinding of the cutting parts may be thus easily performed.

Also, in the step S300 of machining the cutting parts 120, 220, 320, 420 and 520, the cutting parts are ground by a relief grinder so as to have the same cutting relief angle in the circumferential direction. Therefore, the cutting parts 120, 220, 320, 420 and 520 are formed of a curved shape which is bent in the opposite direction to the rotating direction of the tool. The curved cutting parts 120, 220, 320, 420 and 520 may allow a smooth contact angle to be formed between the cutting parts and the workpiece, when the workpiece is machined by the cutting tool, and thus may reduce the wear of the cutting parts, and also may allow the workpiece to be accurately machined.

Also, in the case of the end-mill illustrated in FIGS. 3A and 3B and the slot milling cutter illustrated in FIGS. 6A and 6B, the cutting parts 120 and 420 may have chip breakers 121 and 421 formed of the slot shape. The chip breakers 121 and 421 are machined such that a plurality of gear teeth are formed at an end of each cutting part. Therefore, chips do not fuse and may be discharged smoothly at the time of cutting.

According to the present invention, after the body part and the cutting part are treated by the high temperature coating process, cracks may be prevented from occurring at the surface of the coated tool.

Also, according to the present invention, the space is ensured between the cutting part and the regrinding tool, and thus regrinding of the cutting part can be easily performed, and the surface of the workpiece may be accurately machined.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of manufacturing a cemented carbide cutting tool, comprising:
   a) bonding a body part of hot work tool steel and a cutting part of cemented carbides together by heat treatment;
   b) cooling slowly the bonded body part and cutting part for 24 hours in a vacuum chamber;
   c) machining the cutting part to have a predetermined pattern according to its purpose and forming a cutting tool;
   d) coating a surface of the machined cutting tool with a film of at least one of a metallic oxide, a nitride and a carbide so as to enhance mechanical properties of the cutting tool; and
   e) cooling the coated cutting tool for a preset period of time in air.

2. The method of claim 1, wherein the hot work tool steel is SKD61 and the step a) comprises bonding the body part and the cutting part at a temperature of 800 to 1200° C. by high-frequency welding or oxygen welding.

3. The method of claim 1, wherein the step c) comprises grinding the cutting part by a relief grinder so that a plurality of blades having the same cutting relief angle are formed of a curved shape in a circumferential direction of the cutting part.

4. The method of claim 1, wherein the step d) comprises depositing a titanium aluminum nitride (TiAlN) on a surface of the cutting tool at a temperature of 400 to 700° C. with a thickness of 2 to 4 micro-meters.

* * * * *